(12) United States Patent
Yi

(10) Patent No.: US 11,628,816 B2
(45) Date of Patent: Apr. 18, 2023

(54) FLUID LEVEL INDICATOR SENSOR BASED ON MOTOR SPEED

(71) Applicant: Robert Bosch GmbH, Stuttgart (DE)

(72) Inventor: Ming Yi, Canton, MI (US)

(73) Assignee: Robert Bosch GmbH, Stuttgart (DE)

( * ) Notice: Subject to any disclaimer, the term of this patent is extended or adjusted under 35 U.S.C. 154(b) by 36 days.

(21) Appl. No.: 17/373,501

(22) Filed: Jul. 12, 2021

(65) Prior Publication Data

US 2023/0008546 A1  Jan. 12, 2023

(51) Int. Cl.
  *B60T 17/22*  (2006.01)
  *B60T 13/74*  (2006.01)
  *G01R 33/07*  (2006.01)

(52) U.S. Cl.
  CPC ............ *B60T 17/225* (2013.01); *B60T 13/74* (2013.01); *G01R 33/07* (2013.01); *B60T 2250/03* (2013.01); *B60T 2250/04* (2013.01)

(58) Field of Classification Search
  CPC .................................................. B60T 17/225
  See application file for complete search history.

(56) References Cited

U.S. PATENT DOCUMENTS

| | | |
|---|---|---|
| 4,884,444 A | 12/1989 | Tuckey |
| 5,136,883 A | 8/1992 | Jannotta |
| 6,485,171 B1 | 11/2002 | Wang et al. |
| 7,412,905 B1 | 8/2008 | Bishel |
| 7,832,268 B2 | 11/2010 | Morris |
| 8,230,729 B2 | 7/2012 | Beneker et al. |
| 2022/0220950 A1* | 7/2022 | Janecek ............... F04B 49/123 |

* cited by examiner

*Primary Examiner* — Eric S. McCall
(74) *Attorney, Agent, or Firm* — Michael Best & Friedrich LLP

(57) ABSTRACT

A fluid level indicator and method of determining a fluid level. In one example, a fluid level indicator is configured to be disposed in a brake fluid reservoir of a vehicle. A motor drives the fluid level indicator at a constant horsepower. A motor sensor monitors the speed of the motor. A controller receives the motor speed data from the motor sensor and receives vehicle movement data from other vehicle sensors. The controller determines the level of the brake fluid based on the motor speed and the vehicle movement data.

20 Claims, 3 Drawing Sheets

FLUID LEVEL INDICATOR SENSOR BASED ON MOTOR SPEED

BACKGROUND

Embodiments relate to improved fluid level indicators.

Most vehicles are equipped with fluid reservoirs for storing vehicle fluids (e.g. a gas tank, an oil pan, a brake fluid reservoir). Some of these fluid reservoirs are equipped with fluid level indicator sensors designed to produce an indication of a level of the fluid in the reservoir. Brake fluid level indicators often produce a brake fluid level indication based on the position of a float that sits on the surface of the brake fluid within the reservoir. As the brake fluid leaves the reservoir, the level of the brake fluid decreases, and the float sinks with the level of the brake fluid. However, if the vehicle is accelerating or oriented in a way that causes the brake fluid to concentrate disproportionately in one area of the reservoir, the float will rise to the level of the concentrated fluid, and the fluid level indicator will consequently give an inaccurate fluid level indication.

SUMMARY

One embodiment provides a fluid level indicator for a vehicle. The fluid level indicator includes a DC motor having a rotor. The rotor includes a blade. The fluid level indicator also includes a motor speed sensor and an electronic processor. The rotor is configured to be disposed in a fluid reservoir. The electronic processor is configured to receive a motor speed (N) from the motor speed sensor, and to receive a vehicle movement indication. The electronic processor is further configured to correlate the motor speed to one or more factors selected from the group consisting of a horsepower of the motor, a fluid density, a shape or size of the blade, and the vehicle movement indication to produce a correlation. The electronic processor is additionally configured to determine a fluid level of a fluid based on the correlation.

Another embodiment provides a method of measuring a fluid level of a vehicle fluid. The method includes sensing, via a motor speed sensor, a motor speed of a DC motor including a rotor having a blade, where the rotor and the blade configured to be immersed in the vehicle fluid. The method also includes receiving, via an electronic processor, the motor speed from the motor speed sensor, and receiving, via the electronic processor, a vehicle movement indication. The method also includes correlating, via the electronic processor, the motor speed to one or more factors selected from the group consisting of a horsepower of the motor, a fluid density, a shape or size of the blade, and the vehicle movement indication. The method additionally includes determining, via the electronic processor, the fluid level of the vehicle fluid based on the correlation.

Yet another embodiment provides, a fluid level indicator that includes a DC motor and that is configured to determine a fluid level of a vehicle fluid. The fluid level indicator includes a motor speed sensor configured to sense a motor speed of the DC motor and a rotor. The rotor is configured to be immersed in the vehicle fluid and includes a blade. The rotor is configured to be driven by the DC motor. The fluid level indicator also includes an electronic processor configured to correlate the motor speed to one or more factors selected from the group consisting of a horsepower of the motor, a fluid density, a shape or size of the blade, and a vehicle movement indication, to produce an initial correlation and an adjusted correlation. The electronic processor is configured to produce the initial correlation by correlating the motor speed (N), the horsepower of the motor (P), and a constant related to the shape or size of the blade (K) to determine the fluid density ($\rho$) using an equation: $P=K*\rho*N^3$.

Other embodiments and aspects will become apparent by consideration of the detailed description and accompanying drawings.

DETAILED DESCRIPTION

Before any embodiments are explained in detail, it is to be understood that the embodiments described and illustrated are not limited in their application to the details of construction and the arrangement of components set forth in the following description or illustrated in the following drawings. Other embodiments are possible and embodiments described and illustrated are capable of being practiced or of being carried out in various ways.

Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. As used within this document, the word "or" may mean inclusive or. As a non-limiting example, if it we stated in this document that "item Z may comprise element A or B," this may be interpreted to disclose an item Z comprising only element A, an item Z comprising only element B, as well as an item Z comprising elements A and B.

A plurality of hardware and software-based devices, as well as a plurality of different structural components may be used to implement various embodiments. In addition, embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the invention may be implemented in software (for example, stored on non-transitory computer-readable medium) executable by one or more processors. For example, "control units" and "controllers" described in the specification can include one or more electronic processors, one or more memory modules including non-transitory computer-readable medium, one or more input/output interfaces, one or more application specific integrated circuits (ASICs), and various connections (for example, a system bus) connecting the various components. Functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way, but may also be configured in ways that are not listed.

Figure 1:
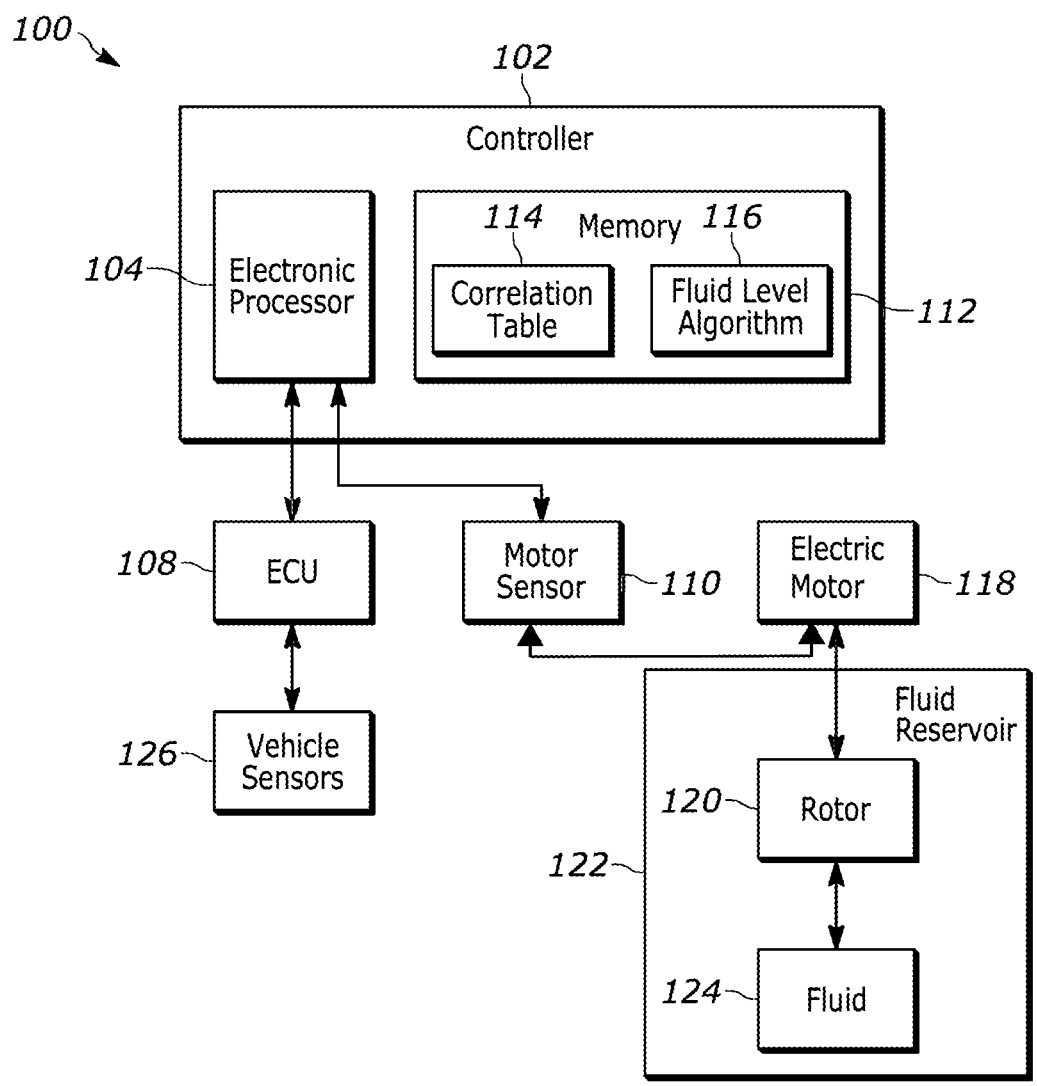
FIG. 1 illustrates a hardware configuration for a controller of a fluid level indicator.

FIG. 1 illustrates a hardware configuration for a fluid level indicator 100. The fluid level indicator 100 includes a controller 102. The controller 102 includes an electronic processor 104 and a memory 112. The electronic processor 104 is connected to an ECU 108 and a motor sensor 110 of the fluid level indicator 100. The memory 112 includes correlation table 114 and a fluid level algorithm 116. The motor sensor 110 is in communication with an electric motor 118 including a rotor 120 and is configured to measure a mechanical or electrical operational parameter of the electric motor 118 or the rotor 120. The rotor 120 is configured to be disposed in a fluid reservoir 122 containing a fluid 124. The fluid level indicator 100 is configured to determine the level of this fluid 124.

The ECU 108 is configured to, among other things, receive or produce a number of vehicle movement indicators or operational parameters of the vehicle. In the embodiment shown, the ECU 108 receives a vehicle movement indication and a vehicle orientation. For example, the ECU 108 may be configured to receive a lateral acceleration, a longitudinal acceleration, a yaw rate, an orientation, and a position of the vehicle from a plurality of vehicle sensors 126 positioned throughout a vehicle (not shown). Additionally, the ECU 108 is configured to receive temperature readings and pressure readings from the plurality of vehicle sensors 126. ECU 108 may also be configured to derive functionally equivalent values, and additional values by processing proxy sensor readings. For example, the ECU 108 may be configured to receive an engine coolant temperature indicator from the vehicle sensors 126 and determine a fluid temperature of another vehicle fluid (e.g., brake fluid) based on the engine coolant temperature.

The motor sensor 110 senses an operational parameter of the electric motor 118. For example, the motor sensor 110 may be a motor speed sensor configured to detect the rotational speed of the rotor 120 and produce a sensed motor speed. As another example, the motor sensor 110 may be configured to detect an amount of current drawn by an electric motor 118 that drives the rotor 120 of the fluid level indicator 100. In some embodiments, the motor sensor 110 is a hall sensor configured to measure an electrical field of the electric motor 118. In other embodiments, the motor sensor 110 is a current sensor configured to measure an amount of current drawn by the electric motor 118. In still other embodiments, a power wire (not shown), a ground wire (not shown), and a speed signal wire (not shown) connect to the electric motor 118. In such embodiments, the motor sensor 110 may be a sensor configured to sense the speed signal on the speed signal wire.

The memory 112 is configured to make the correlation table 114 and fluid level algorithm 116 accessible for execution by the electronic processor 104. The memory 112 may be local to the electronic processor 104 in that the memory 112 is in physical, electrical communication with the electronic processor 104. The fluid level algorithm 116 is configured to perform an initial correlation of the density of the fluid 124 to the speed of the rotor 120, the current drawn by the electric motor 118, or an electric field drawn by the electric motor 118 as it drives rotor 120. As will be described in greater detail below, in some embodiments, the fluid level algorithm 116 assumes a characteristic about the fluid to be measured and derives additional characteristics of the fluid from data from the ECU 108. The fluid level algorithm 116 then factors in the operational parameters of the vehicle, also obtained via the ECU 108, to obtain an adjusted correlation and fluid level. For example, in some cases, the fluid level algorithm 116 determines an initial level of the fluid 124 based on an assumed fluid density and vehicle movement indication. The fluid level algorithm 116 then receives vehicle movement indication data, vehicle orientation data, and proxy parameter data (e.g., proxy fluid temperature) from the ECU 108. The controller 102 determines from the proxy parameter data that the fluid 124 is of a lower viscosity than initially assumed. The controller 102 may also determine from the vehicle orientation data that, because the vehicle is on an incline, the fluid 124 is likely disproportionately shifted to one side of the fluid reservoir 122, leading the motor sensor 110 to produce misleading data indicating that the fluid level is low (e.g., the motor sensor 110 detects a high speed of the rotor 120, a low current drawn by the electric motor 118, etc.). Using these determinations as factors in the fluid level algorithm 116, in some instances, the controller 102 determines that the level of the fluid 124 is higher or lower than the initially determined level of the fluid 124. Accordingly, the controller 102 may produce an adjusted level determination for fluid 124.

In some embodiments, the fluid level algorithm 116 continuously determines the fluid level. The fluid level algorithm 116 may also determine a moving average fluid level. In some embodiments, the memory 112, or part of, it may be remotely located. For example, the correlation table 114, or fluid level algorithm 116 may be stored in a cloud computing system, and accessible by the controller 102 via an internet connection (not shown). The correlation table 114 contains one or more mappings that correlate vehicle operational parameters to other vehicle operational parameters.

Figure 2:
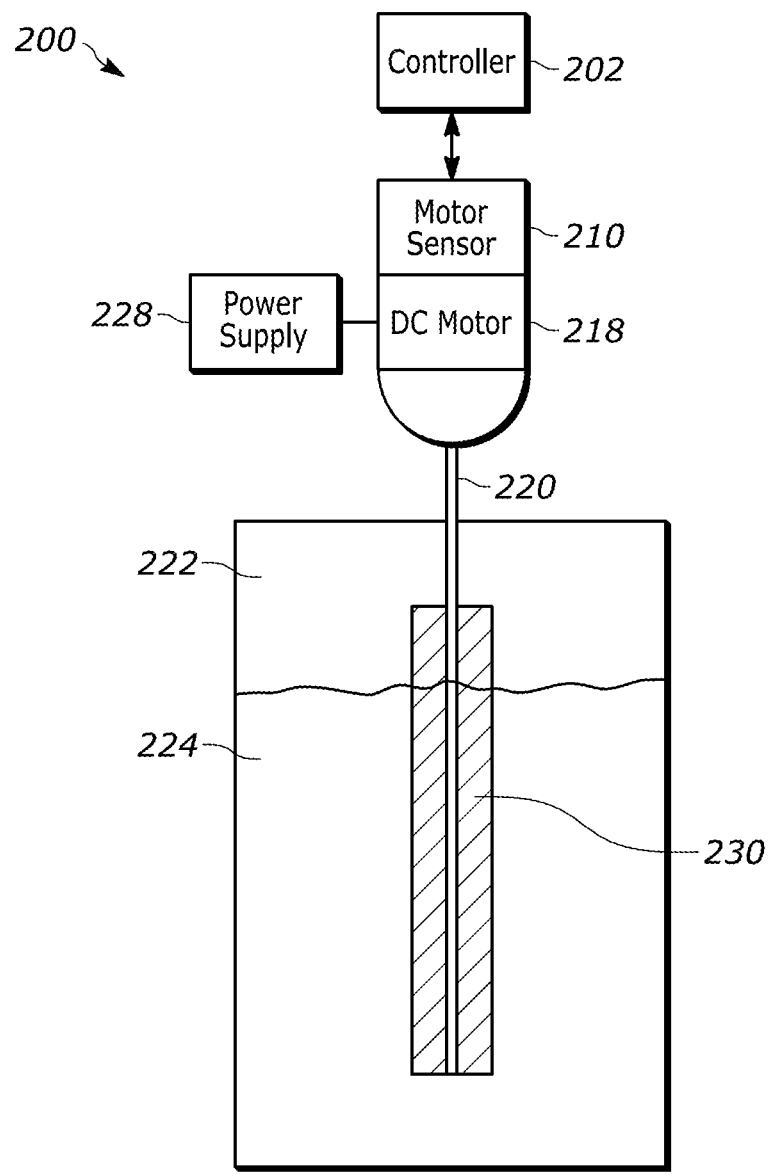
FIG. 2 illustrates an electro-mechanical configuration of a fluid level indicator with its rotor and blades disposed in a fluid reservoir.

FIG. 2 depicts an electro-mechanical configuration of a fluid level indicator 200. In the example shown, the fluid level indicator 200 includes a controller 202, a motor sensor 210, a power supply 228, and a DC motor 218. The rotor 220 of the DC motor 218 includes a plurality of blades 230 and is disposed in fluid 224 contained in fluid reservoir 222. The power supply 228 is configured to drive the DC motor 218. In some embodiments, the power supply 228 drives the DC motor 218 at a constant voltage and/or current so that the motor generates a constant or nearly constant horsepower. The motor sensor 210 senses changes to the speed or torque of the DC motor 218, or changes to the current drawn by the DC motor 218.

The fluid reservoir 222 is configured to act as a holding vessel for the fluid 224, The rotor 220 is disposed in the fluid reservoir 222, for stirring the fluid 224. When fluid 224 is present in the fluid reservoir 222, the fluid 224 at least partially fills the fluid reservoir 222 and, at a certain level, envelopes the rotor 220 such that if the rotor 220 is turned by the DC motor 218, the fluid 224 is stirred in the fluid reservoir 222 by the turning motion of the rotor 220. In the embodiment shown, the rotor 220 includes blades 230. The blades 230 help to stir the fluid 224 when the rotor 220 is turned, and also increase the drag on the rotor 220 while it turns in the fluid 224. In the embodiment shown, the blades 230 are generally planar and extend in a longitudinal direction along the length of the rotor 220. However, it is contemplated that the blades 230 could be replaced by another drag-increasing extension configured to stir the fluid 224 as the rotor 220 turns (e.g., propellers spaced longitudinally and radially along the length of the rotor 220, a corkscrew blade configuration, a single blade configuration, etc.). In some embodiments, the rotor 220 does not include blades 230 and the level of fluid 224 is calculated based on a drag of the fluid 224 on the rotor 220 alone as the rotor 220 turns (e.g., where the rotor 220 is a cylinder with no blades 230 or extensions). Additionally, a sensor (apart from the motor sensor 210) may be disposed in the rotor 220 and help in determining the level of the fluid 224 by providing sensor data. For example, a temperature sensor or density sensor may be disposed in the rotor 220 and configured to provide fluid temperature sensor data or fluid density sensor data to the controller 102.

The power supply 228 conditions power for driving the DC motor 218 at a constant horsepower by ensuring that a value given by multiplying the revolutions per minute (rpm) of the rotor 220 torque output of the DC motor 218 does not vary substantially in value. As the fluid 224 being measured by the fluid level indicator decreases in viscosity, the rpm of the rotor 220 naturally increases, while the torque output of and current drawn by the DC motor 218 naturally decreases. That is, the rpm and torque values naturally and proportionally increase and decrease respectively to maintain a constant horsepower output by the DC motor 218 in response to changes in the viscosity, volume, or density of the fluid 224. For example, the power supply 228 may be configured to condition power to drive the DC motor 218 at a constant ½ horsepower (hp). The ½ hp can be calculated by multiplying the rpm of the rotor 220 by the torque output of the DC motor 218

$$\left(\text{e.g.,}\ \frac{8\ \text{foot pound torque} \times 328\ \text{rpm}}{5252}\right).$$

As the fluid 224 becomes easier to stir due to decreased viscosity, decreased volume or density, or a shifting of the fluid 224 within the fluid reservoir 222, the rpm of the rotor 220 will increase (for example, to 660 rpm). That is, in response to a perceived decrease in the level of the fluid 224, the power supply 228 will condition power supplied to the DC motor 218 to have a higher voltage and a lower current. Accordingly, in response to a perceived increase in the level of the fluid 224, the power supply 228 will condition power supplied to the DC motor 218 to have a lower voltage and a higher current.

In the embodiment shown, the insertion of the rotor 220 of the fluid level indicator 200 into the fluid reservoir 222 creates a liquid-tight seal where the rotor 220 and the fluid reservoir 222 meet. Additionally, the fluid reservoir 222 may include fluid inlets or outlets (not shown) facilitating removal and replacement of fluid 224, and flow of the fluid 224 through one or more vehicle systems. For example, when the fluid 224 is brake fluid, the fluid reservoir 222 may include one or more fluid inlets from and outlets to the braking system (not shown) of the vehicle (e.g., an outlet of fluid reservoir 222 may be to a master cylinder of a braking system).

Figure 3:
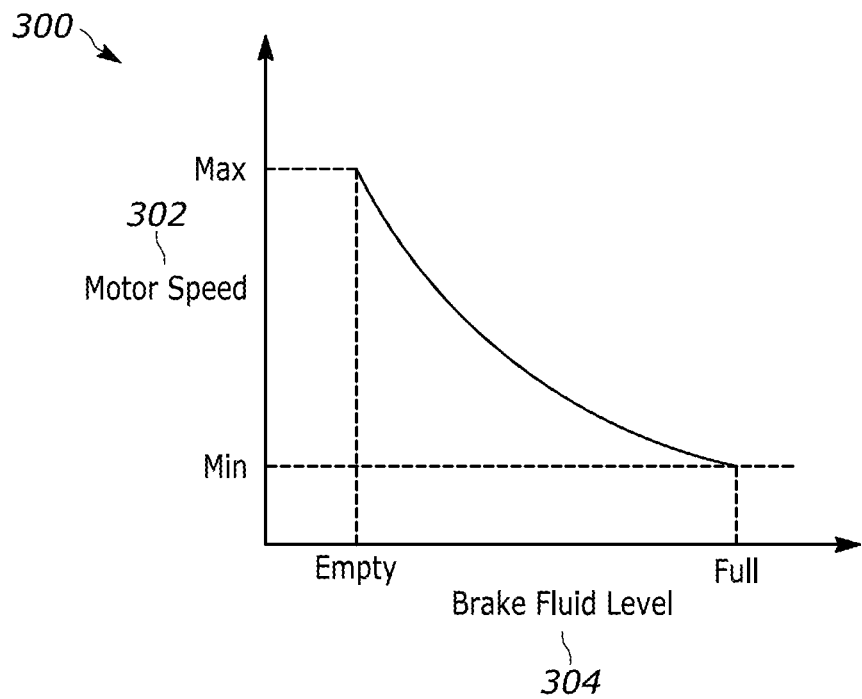
FIG. 3 is a graph of a relationship between a fluid level indicator motor speed and a brake fluid level.

FIG. 3 shows a graph of a relationship 300 between a fluid level indicator motor speed 302 and a brake fluid level 304. This graph assumes that the fluid being measured is brake fluid of a vehicle, the fluid viscosity and fluid density are constant, and that the vehicle is at a standstill. When these assumptions exist, fluid level indicator motor speed 302 will decrease as the brake fluid level 304 increases. This is due to increased drag on the rotor 220 as it turns in a relatively high volume of fluid 224.

Figure 4:
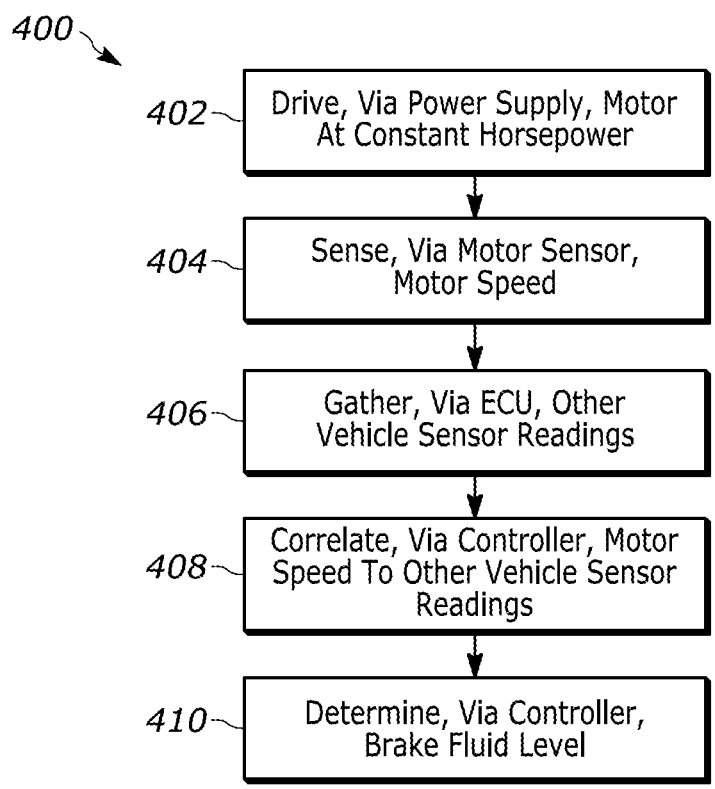
FIG. 4 is a flowchart for a method of determining a level of a fluid in a reservoir.

FIG. 4 shows a flowchart 400 for a method of using a fluid level indicator to determine a fluid level. At block 402 the power supply 228 drives the DC motor 218 at a constant horsepower by continuously ensuring that the mathematical product of the torque of the DC motor 218 and the rpm of the rotor 220 is constant. That is, the power supply 228 ensures that an amplitude and ratio of current to voltage supplied to the DC motor 218 is sufficient to cause the DC motor 218 to output a constant horsepower.

At block 404, the controller 102 determines, using information provided by the motor sensor 210, a value of the rotational speed (for example, rpm) of the rotor 220 of the DC motor 218. The motor sensor 210 may be configured to directly measure the rpm of the rotor 220. In other instances, the motor sensor 210 is configured to sense a voltage drop of the DC motor 218, or current drawn by the DC motor 218. The voltage drop or current drawn may be used to determine a rotational speed of the rotor 220. In some embodiments, the DC motor 218 is brushless, and motor sensor 210 is a hall sensor configured to sense an electromagnetic field of the DC motor 218 during a pole magnet excitation sequence of the DC motor 218. By tracking the pole magnet excitation sequence of the DC motor 218 using the motor sensor 210, the speed of the rotor 220 can be determined. Additionally, in some embodiments, the motor sensor 210 is configured to sense a speed signal on a speed signal wire. The speed signal may be used to determine a rotational speed of the rotor 220.

At block 406, the controller 102 determines, via the ECU 108, other operational parameters of the vehicle. The other operational parameters may include the temperature of another fluid or component of the vehicle, a position of the vehicle, an orientation of the vehicle, or an acceleration of the vehicle. When fluid 224 is the brake fluid of a vehicle, a temperature of the engine coolant may be used as a proxy indicator of the temperature and viscosity of the brake fluid. Further a tilting of the vehicle, or a forward lateral acceleration of the vehicle, may cause the fluid 224 to shift to one side of the fluid reservoir 222 and give a false impression of a low level of the fluid 224.

At block 408, the controller 102 correlates the determined speed or torque of the DC motor 218 to the other operational parameters of the vehicle using the fluid level algorithm 116. As briefly discussed above, the DC motor 218 is driven by the power supply 228 at a constant horsepower. Voltage affects the speed (for example, RPM) of the DC motor 218, and current affects torque of the DC motor 218. The rotor 220 is immersed into the fluid 224 and turned by the DC motor 218. Accordingly, the speed of the rotor 220 is affected by the viscosity of the fluid 224. Higher speed means lower viscosity, thus higher voltage and lower current. Thus, assuming a known density of the fluid 224, it can also be initially assumed that the speed of the DC motor 218 is inversely proportional to a level of the fluid 224 due to the constant horsepower output of the DC motor 218.

In some embodiments, the density of the fluid 224 may not be known. In such a case, the density of the fluid may be directly measured by a sensor (not shown) disposed in the fluid reservoir 222. In some cases, the controller 102 may take the speed of the DC motor 218 (N), the constant horsepower output of the DC motor 218 (P), a constant related to the size or shape of the blades 230 (K) as inputs, and determine the density of the fluid ρ using the equation:

$$P = K^* \rho^* N^3$$

At block 410, the controller 202 determines the level of the fluid 224 using the determined density of fluid 224 and adjusts it using the vehicle operational parameters received from the ECU 108. For example, if the operational parameters indicate that the vehicle is accelerating up a hill, the controller 202 factors this into the determination of the level of fluid 224 by adjusting the inputs to the fluid level algorithm 116 to reflect an assumption of a lower initial density determination for fluid 224 due to decreased contact of rotor 220 with fluid 224 caused by a shifting of the fluid 224 in the fluid reservoir 222. As another example, if the operational parameters indicate that the temperature of fluid 224 is high, the controller 202 factors this into the determination of the level of fluid 224 by adjusting the inputs to the fluid level algorithm 116 to reflect an assumption of a lower initial density determination for fluid 224 due to decreased viscosity of fluid 224.

Although systems and methods for determining the level of a vehicle fluid using a fluid level indicator are described above, it is contemplated that the disclosed systems can be used to determine a fluid level in a stationary reservoir. It is also contemplated that the disclosed fluid level indicators may take into account secondary fluid reservoirs. It is also contemplated that the disclosed systems and methods may be applied in a variety of different types of vehicles including ground vehicles, airborne vehicles, or watercraft.

Various features, advantages, and embodiments are set forth in the following claims.

What is claimed is:

1. A fluid level indicator for a vehicle, the fluid level indicator comprising:
a DC motor including a rotor having a blade, the rotor configured to be disposed in a fluid reservoir;
a motor speed sensor; and
an electronic processor configured to:
receive a motor speed (N) from the motor speed sensor;
receive a vehicle movement indication;
correlate the motor speed to the vehicle movement indication to produce a correlation; and
determine a fluid level of a fluid based on the correlation.

2. The fluid level indicator of claim 1, wherein the motor speed sensor is a hall sensor configured to sense the motor speed by sensing an electromagnetic field of the DC motor during a pole magnet excitation sequence of the DC motor.

3. The fluid level indicator of claim 1, wherein the vehicle movement indication is a lateral acceleration of the vehicle, a longitudinal acceleration of the vehicle, or a yaw rate of the vehicle.

4. The fluid level indicator of claim 1, wherein one or more factors selected from the group consisting of a horsepower of the motor, a fluid density, and a shape or size of the blade are also correlated to the motor speed and the vehicle movement indication to produce the correlation.

5. The fluid level indicator of claim 1, wherein the electronic processor is configured to receive an engine coolant temperature and to correlate the motor speed to the engine coolant temperature.

6. The fluid level indicator of claim 1, further comprising a temperature sensor disposed in the rotor and configured to sense a fluid temperature of the fluid.

7. The fluid level indicator of claim 6, wherein the electronic processor is further configured to receive the fluid temperature from the temperature sensor and to correlate the motor speed to the fluid temperature.

8. The fluid level indicator of claim 1, wherein the electronic processor is further configured to produce an initial correlation and an adjusted correlation,
wherein producing the initial correlation comprises correlating, by the electronic processor, the motor speed (N), the horsepower of the motor (P), a constant related to the shape or size of the blade (K), and the fluid density ($\rho$) using an equation:

$$P=K*\rho*N^3.$$

9. The fluid level indicator of claim 8, wherein producing the adjusted correlation comprises adjusting, by the electronic processor, a first value of the fluid density ($\rho$) in the initial correlation based on the vehicle movement indication.

10. The fluid level indicator of claim 8, wherein producing the adjusted correlation comprises adjusting, by the electronic processor, a second value of the motor speed (N) in the initial correlation based on the vehicle movement indication.

11. A method of measuring a fluid level of a vehicle fluid, the method comprising:
sensing, via a motor speed sensor, a motor speed of a DC motor including a rotor having a blade, the rotor and the blade configured to be immersed in the vehicle fluid;
receiving, via an electronic processor, the motor speed from the motor speed sensor;
receiving, via the electronic processor, a vehicle movement indication;
correlating, via the electronic processor, the motor speed to the vehicle movement indication to produce a correlation; and
determining, via the electronic processor, the fluid level of the vehicle fluid based on the correlation.

12. The method of claim 11, wherein sensing, via the motor speed sensor, the motor speed of the DC motor comprises sensing an electromagnetic field of the DC motor during a pole magnet excitation sequence of the DC motor.

13. The method of claim 11, wherein sensing the motor speed of the DC motor comprises sensing, via the motor speed sensor, an amount of current drawn by the DC motor.

14. The method of claim 11, wherein sensing the motor speed of the DC motor comprises sensing, via the motor speed sensor, an amplitude of a signal on a speed signal wire of the DC motor.

15. The method of claim 11, wherein the vehicle movement indication is produced by an ECU of a vehicle.

16. The method of claim 11, wherein the correlating further includes correlating one or more factors selected from the group consisting of a horsepower of the motor, a fluid density, and a shape or size of the blade to the motor speed and the vehicle movement indication to produce the correlation.

17. The method of claim 11, further comprising sensing, via a temperature sensor, a fluid temperature of the fluid.

18. A fluid level indicator including a DC motor and configured to determine a fluid level of a vehicle fluid, the fluid level indicator comprising:
a motor speed sensor configured to sense a motor speed of the DC motor;
a rotor configured to be driven by the DC motor, wherein the rotor includes a blade and is configured to be immersed in the vehicle fluid;
an electronic processor configured to correlate the motor speed to one or more factors selected from the group consisting of a horsepower of the motor, a fluid density, a shape or size of the blade, and a vehicle movement indication, to produce an initial correlation and an adjusted correlation, wherein producing the initial correlation comprises correlating, by the electronic processor, the motor speed (N), the horsepower of the motor (P), and a constant related to the shape or size of the blade (K) to determine the fluid density (ρ) using an equation:

$P=K*\rho*N^3$.

19. The fluid level indicator of claim 18, wherein producing the adjusted correlation comprises adjusting, by the electronic processor, a value of the fluid density (ρ) in the initial correlation based on the vehicle movement indication.

20. The fluid level indicator of claim 18, wherein producing the adjusted correlation comprises adjusting, by the electronic processor, a value of the motor speed (N) in the initial correlation based on the vehicle movement indication.

* * * * *